United States Patent [19]

Hovel et al.

[11] Patent Number: 4,708,883
[45] Date of Patent: Nov. 24, 1987

[54] ANNEALING PROCESS

[75] Inventors: Harold J. Hovel, Katonah; Thomas F. Kuech, Ossining, both of N.Y.

[73] Assignee: International Business Machines Corporation, Armonk, N.Y.

[21] Appl. No.: 821,139

[22] Filed: Jan. 23, 1986

Related U.S. Application Data

[63] Continuation of Ser. No. 630,056, Jul. 12, 1984, abandoned.

[51] Int. Cl.$^4$ .............................................. B05D 3/06
[52] U.S. Cl. ..................................... 427/38; 427/377; 427/383.3; 427/383.9; 437/225
[58] Field of Search .................... 427/38, 85, 87, 91, 427/377, 383.3, 383.9

[56] References Cited

U.S. PATENT DOCUMENTS

| | | | |
|---|---|---|---|
| 4,147,564 | 4/1979 | Magee et al. | 148/1.5 |
| 4,194,927 | 3/1980 | Takagi et al. | 148/1.5 |
| 4,312,681 | 1/1982 | Rupprecht et al. | 148/1.5 |
| 4,383,869 | 5/1983 | Liu | 148/1.5 |
| 4,389,255 | 6/1983 | Chen et al. | 148/1.5 |

FOREIGN PATENT DOCUMENTS 0111085  6/1984  European Pat. Off. .

OTHER PUBLICATIONS

IBM Technical Disclosure Bulletin, vol. 25, No. 11A, Apr. 1983, "Solid Diffusion Source with Textured Surface", R. H. Katyl.

Patent Abstracts of Japan, unexamined applications, E Field, vol. 5, No. 30, Feb. 24, 1981, the Patent Office Japanese Government, p. 135 E 47, Kokai-No. 55-158628 (Tokyo Shibaura Denki K.K.).

Patent Abstracts of Japan, unexamined applications, E section, vol. 136, No. 10, 1977, the Patent Office Japanese Government, p. 6537 E 77, Kokai-No. 52-73673 (Nippon Denki K.K.).

Applied Physics Letters, vol. 38, No. 8, Apr. 15, 1981, J. M. Woodall, et al., "Proximate Capless Annealing of GaAs Using a Controlled-Escess as Vapor Pressure Source", pp. 639-641.

Primary Examiner—Bernard D. Pianalto
Attorney, Agent, or Firm—Pollock, Vande Sande & Priddy

[57] ABSTRACT

An ion implantation annealing source for a controlled excess of the most volatile element of a multielement compound semiconductor whereby the source is provided with interstices and contains the most volatile element of the multielement semiconductor; and process of ion implantation employing the annealing source.

18 Claims, 4 Drawing Figures

ANNEALING PROCESS

This application is a continuation of application Ser. No. 630,056, filed July 12, 1984, abandoned.

DESCRIPTION

1. Technical Field

The present invention is concerned with ion implantation annealing sources suitable for controlled excess of the most volatile element of a multielement compound semiconductor. In addition, the present invention is concerned with the use of the annealing source in the activation of implanted ion impurities in a multielement compound semiconductor crystal.

2. Background Art

Multielement compound semiconductor materials have electro-optical and carrier transport properties useful in semiconductor devices, however, the multielement crystal responds to the effects of such processing operations as heating in ways that not only affect the location of impurities, but also the stoichiometry of the crystal. Where the crystal surface undergoing processing is a relatively broad area, such as is the case where an integrated circuit is being produced, the conditions must be uniform over the entire surface area in order to assure a yield of uniform devices.

One technique of introducing semiconductor property imparting impurities into such multielement compound semiconductor crystals is known as ion implantation. This technique has the advantages of precision positioning, and low in the vicinity of room temperature, processing; but the technique also requires a subsequent annealing step at high temperatures which is necessary to repair crystal damage and to activate the implanted impurities.

With large scale integration of circuits, the surface area becomes larger and ion implantation activation annealing can result in non-uniformity, the major reason being localized loss of the ingredients of the multielement compound semiconductor material.

There have been some efforts to control the problem of uniformity over a multielement compound semiconductor surface when an ion implantation annealing step is employed.

For instance, the tendency of the multielement compound semiconductor GaAs to decompose in processing has received some attention in the art. One technique which has been employed to prevent decomposition is to apply a capping layer, such as $SiO_2$ over the crystal surface. This technique is suggested in U.S. Pat. No. 4,226,667.

Another technique suggested involves the use of a native oxide of the GaAs along the lines suggested in U.S. Pat. No. 3,969,164.

The art has been mainly directed to control of surface stoichiometry. For instance, in U.S. Pat. No. 4,135,952 an effort is made to keep GaAs from decomposing during ion implantation annealing by placing the GaAs crystal surface in proximity with a GaAs crystal in a Ga solution. The desirability of having an excess of the more volatile element of the GaAs is suggested in U.S. Pat. No. 4,312,681 wherein InAs is used as a source of excess arsenic to prevent decomposition. The processses suggested in U.S. Pat. Nos. 4,135,952 and 4,312,681 require a standard long, about 30 minute, annealing step.

In Appl. Phys. Lett. 38, 815 April 1981, page 639, detrimental effects of diffusion of certain substrate impurities in the material GaAs during long annealing steps is recognized and high excess As pressure from InAs is employed for control.

In Device Research Conference IV A-7-June 26-28, 1982, selective evaporation of GaAs during a conventional long ion implantation annealing step and diffusion of Mn from the substrate are reported as problems.

Processes which employ gallium arsenide wafers as a substrate for the ion implanted gallium arsenide samples are quite beneficial in that they provide a clean, well-controlled source of excess arsenic at the interface between the two. However, equal amounts of arsenic leave the substrate and the implanted wafer facing down upon the substrate, such that the excess arsenic benefit is only a factor of 2 which has inherent limits with respect to control of the annealing process.

In addition, U.S. patent application Ser. No. 440,655 to Hodgson, et al. filed Nov. 10, 1982 discloses the ion implantation impurity activation in a multielement compound semiconductor crystal such as gallium arsenide over a broad integrated circuit device area using a short time anneal in the proximity of a uniform concentration of the most volatile element of the crystal in solid form over the broad integrated circuit device area surface. For instance, a gallium arsenide integrated circuit wafer having ion implanted impurities in the surface for an integrated circuit is annealed at temperatures of about 800° C. to about 900° C. for a time in the order of about 1 to about 20 seconds in the proximity of a uniform layer of solid arsenic.

The solid, most volatile element becomes a uniform controlled gas source during the annealing step used to activate the ion implanted impurities permitting a short, of the order of a few seconds, conventional temperature, annealing step.

In addition, U.S. patent application Ser. No. 440,654 filed Nov. 10, 1982, entitled "Intermediate Passivation and Cleaning of Compound Semiconductor Surfaces" by Freeouf, et al. discloses an arrangement for providing the solid arsenic source on a wafer of gallium arsenide by a photoetch technique. The disclosures of the above two U.S. patent applications are incorporated herein by reference.

SUMMARY OF INVENTION

The present invention is concerned with an ion implantation annealing source for a controlled excess of the most volatile element of a multielement compound semiconductor comprising a member having at least a major surface thereof in contact with the ion implanted multielement semiconductor wherein said surface of the source is provided with interstices. The surface can contain said most volatile element of said multielement semiconductor and/or be covered with a layer containing the most volatile element.

In addition, the present invention is concerned with a process for uniform ion implantation activation in a multielement compound semiconductor crystal comprising:

implanting semiconductor property imparting impurities through a device area surface of said crystal;

placing a major surface of a member in contact with said device area surface of said crystal wherein said member is provided with interstices; and annealing the combination of said member and said crystal while confining the vaporization product of said member to said surface. The annealing is preferably a short elevated temperature cycle anneal.

The surface of the member can contain the most volatile element and/or be covered with a layer containing the most volatile element.

The quantity of the most volatile component of the multiple element compound such as As in contact uniformly all over the surface of the future circuit area of the implanted wafer when vaporized during the anneal cycle prevents erosion of the elements of the multielement compound (e.g., As and Ga), inhibits concentration changes of the most volatile element (e.g., As) by diffusion, provides excess vapor pressure of the most volatile element (e.g., As) to drive implanted dopants (e.g., Group IV materials) onto donor site.

BEST AND VARIOUS MODES FOR CARRYING OUT THE INVENTION

The present invention includes a number of techniques for obtaining the desired excess vapor pressure of the volatile element in contact with the implanted wafer to be annealed. The annealing employed can be a relatively short annealing cycle.

In order to facilitate explanation of the present invention, the description will be focused on the particular multielement compound semiconductor material gallium arsenide (GaAs). However, the present invention is suitable for the processing of other multiple element compound semiconductor materials such as InP, GaAlAs, and GaInAs.

Figure 1:
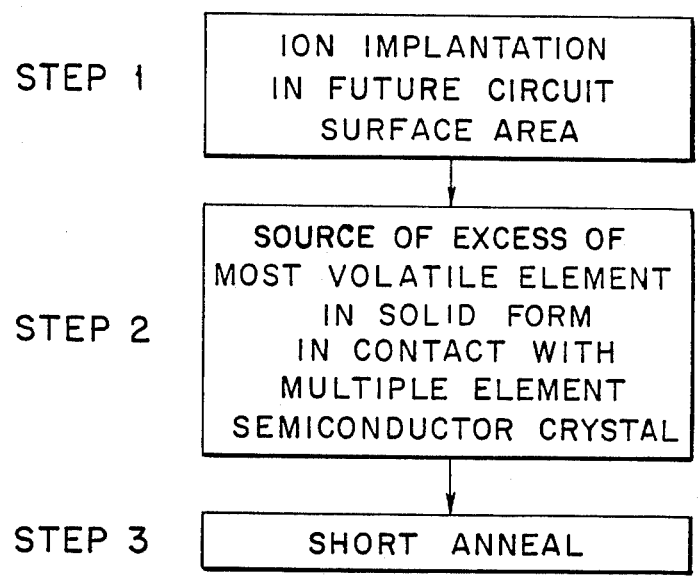
FIG. 1 is a flow chart illustrating steps in carrying out the present invention.

Referring to FIG. 1, a flow diagram is provided wherein in Step 1, a multiple element compound semiconductor crystal substrate is implanted with semiconductor property imparting ions in the portion of the crystal that is to be the area of the future integrated circuit. The depth and extent of implantation will vary with the properties being imparted. For instance, silicon ions are introduced by ion bombardment into a crystal GaAs device wafer at energies of about 50 to about 200 kiloelectron volts (KeV) at fluences of about $10^{12}$ to about $10^{14}$ ions per square centimeter and a depth of about 1000 angstroms to about 4000 angstroms.

Other commonly employed n-type dopants are Se, Ge and S. Examples of p-type dopants are Zn, Mn, Mg, Cd, and Be. The implantation energies and fluences vary somewhat depending upon the dopant and the application, but are generally similar to those discussed herein above.

In Step 2, the substrate is positioned with the future device area in contact with the ion implantation annealing source to provide the uniform, yet controlled, quantity of excess of the most volatile element over the entire surface of the substrate.

Figure 2:
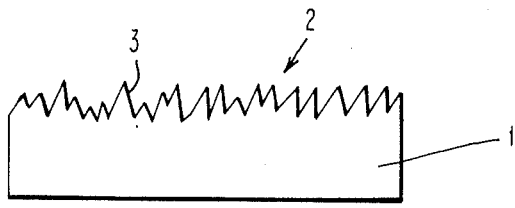
FIGS. 2-4 are schematic diagrams of ion implantation sources suitable for the present invention.

Reference to FIG. 2 illustrates one type of ion implantation annealing source 1. This ion implantation annealing source 1, in accordance with the present invention, has a surface 2 provided with interstices 3 and contains the most volatile element of the multielement semiconductor. In the preferred aspects of the present invention, the number and depth of the interstices is such that the projected surface area of the annealing source is at least about 4 times and most preferably about 4 to about 10 times the geometric surface area of the source.

Accordingly, an increase of about 4 to about 10 times the amount of excess of the most volatile element such as the As, as compared to the annealing source used and described in U.S. patent application Ser. No. 440,655 is obtained.

The source 1 may be a compound semiconductor such as GaAs or InAs used to supply excess As to an implanted GaAs wafer during the annealing. The availability of excess As obtained is greater than would be obtained using a flat or smooth GaAs or InAs source by the ratio of the increased surface area.

Figure 3:
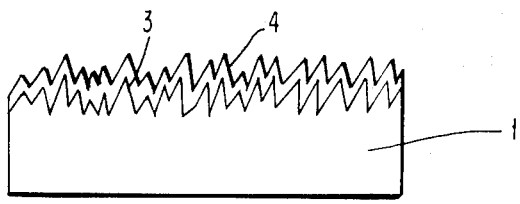

Reference to FIG. 3 illustrates the source 1 having an added extra coating of the most volatile element 4 which further increases the quantity of excess volatile element available.

Illustrative of a suitable source is a gallium arsenide or indium arsenide substrate having interstices or having a dendritic surface and having a quantity of the most volatile element of the multielement semiconductor such as the arsenic impregnated within the interstice of the substrate or having a layer coated. Preferably, the amount of the most volatile element of the multielement semiconductor provided on the substrate is the maximum amount that could be present. This provides for the greatest benefits in accordance with the present invention.

The gallium arsenide or indium arsenide substrate can be roughened to contain interstices by anisotropic etching of a smooth gallium arsenide or indium arsenide surface. An example of a suitable technique is etching the substrate in potassium hydroxide of about 300° C. to about 400° C. for about 10 to about 30 minutes. Other techniques, particularly for gallium arsenide, are described in Journal of the Electrochemical Society, Vol. 130, p. 2427, December 1983, disclosure of which is incorporated herein by reference.

A dendritic GaAs or InAs surface can be obtained by the vapor growth of 10-15 microns thick GaAs or InAs layers by metal organic chemical vapor deposition at high rates such as 1-3 microns per minute and at temperatures of 600° C. to 700° C. A dendritic surface can also be produced by the vapor growth of aluminum arsenide layers on gallium arsenide or germanium substrates at 600° C. to 800° C. at rates of 0.5 to 3 microns per minute.

Moreover, if desired, the substrate acting as the source of excess volatile element such as arsenic can be other than the gallium arsenide or indium arsenide and includes such substrates as silicon including polycrystalline silicon and amorphous silicon, silicon dioxide, aluminum oxide, germanium, and metals such as tungsten.

Layers of GaAs, InAs, or AlAs can be deposited on the desired substrate by chemical vapor deposition as described above. Layers of excess As can also be deposited on the desired substrate.

The most volatile element of the multielement component such as the arsenic can be provided onto the substrate by evaporation, sputtering, or vapor deposition techniques. Layers of about 0.1 to about 1 micron thick are preferred.

Figure 4:
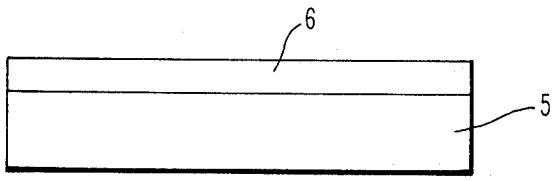

Referring to FIG. 4, there is illustrated another example of an As-rich source for annealing purposes. A layer of amorphous or polycrystalline silicon 6 is deposited by chemical vapor deposition or plasma-assisted chemical vapor deposition upon a suitable substrate 5 which may be Si, $SiO_2$, $Al_2O_3$, or tungsten. The layer is deposited in an atmosphere of an As-containing species such as arsine (AsH$_3$), and a high quantity of As is contained in the layer. Polycrystalline silicon can contain as much as 6-7% As while amorphous Si as much as 10-20%. When in contact with the implanted wafer and heated, the poly or amorphous Si emits As to supply the desired excess As vapor. The substrate 5 could be processed to produce a layer 6 with a rough surface as 2 in FIG. 2.

As described in U.S. patent application Ser. No. 440,655, the ion-implantation annealing source can include a recess in the backing so that the edges of the backing contact the device area surface and confine the volatile element vapor in a limited controlled volume.

In the third step of FIG. 1, the short time, conventional temperature, annealing step takes place. The extent of the annealing step will be relative to the depth and extent of the implantation but, in accordance with the present invention, greater annealing control, longer cycles, and greater simplicity is achieved.

The short-time annealing usually takes place for about 2 seconds to about 20 seconds at temperatures between about 900° C. and 1100° C.

While the sources of excess arsenic described hereinabove are particularly useful for short-time annealing processes, they are also advantageous as sources of excess arsenic in conventional furnace anneals. For example, gallium arsenide or indium arsenide substrate with roughened surfaces and arsenic-containing polycrystalline or amorphous silicon release arsenic atoms over a considerable period of time, allowing them to be used in longer time anneals as well as short time anneals. Such longer time anneals are generally at temperatures of about 800° C. to 850° C. for periods of about 10 to 20 minutes.

What is claimed is:

1. A process for uniform ion implantation activation in a multielement compound semiconductor crystal comprising:
   implanting semiconductor property imparting impurities through a device area surface of said crystal;
   placing a major surface of a member in contact with said device area surface of said crystal wherein said member is provided with interstices and said member contains the most volatile element of said multielement compound semiconductor crystal; and
   annealing the combination of said member and said crystal while confining the vaporization product of said member to said surface.

2. The process of claim 1 wherein said multielement compound semiconductor is a member of the group of GaAs, InP, GaAlAs, and GaInAs.

3. The process of claim 1 wherein said multielement compound semiconductor is GaAs and said most volatile element is As.

4. The process of claim 1 wherein said member has a projected surface area about 4 to about 10 times the geometric surface area.

5. The process of claim 1 wherein said member is a gallium arsenide substrate.

6. The process of claim 1 wherein said member is an indium arsenide substrate.

7. The process of claim 1 which comprises implanting silicon ion into a gallium arsenide crystal at energies of about 50 to about 200 kiloelectron volts at fluences of about $10^{12}$ to about $10^{14}$ ions per square centimeter and a depth of about 1000 angstroms to about 4000 angstroms.

8. The process of claim 1 wherein said member has a projected surface area at least 4 times the geometric surface area.

9. The process of claim 1 wherein said member includes a member of the group of indium arsenide, aluminum arsenide, and gallium arsenide.

10. The process of claim 1 which comprises annealing for about 2 to about 20 seconds at temperatures of about 900° C. to about 1100° C.

11. A process for uniform implantation activation in a multielement compound semiconductor crystal comprising:
    implanting semiconductor property imparting impurities through a device area surface of said crystal;
    placing a major surface of a member in contact with said device area surface of said crystal wherein said member is provided with interstices and wherein said member is covered with one or more layers which contain the most volatile element of said crystal; and
    annealing the combination of said member and said crystal.

12. The process of claim 11 wherein said most volatile element is present in a layer of about 0.1 to about 1 micron thick.

13. The process of claim 11 wherein said layer containing said most volatile element includes a member of the group of polycrystalline silicon and amorphous silicon.

14. The process of claim 11 which comprises implanting silicon ion into a gallium arsenide crystal at energies of about 50 to about 200 kiloelectron volts at fluences of about $10^{12}$ to about $10^{14}$ ions per square centimeter and a depth of about 1000 angstroms to about 4000 angstroms.

15. The process of claim 11 wherein said member has a projected surface area at least 4 times the geometric surface area.

16. The process of claim 11 wherein said member is selected from the group silicon, silicon dioxide, aluminum oxide, germanium, tungsten, gallium arsenide, and indium arsenide.

17. The process of claim 11 wherein said layers containing the most volatile element of said crystal are selected from the group indium arsenide, gallium arsenide, aluminum arsenide, arsenic, polycrystalline silicon, and amorphous silicon.

18. The process of claim 11 which comprises annealing for about 2 to about 20 seconds at temperatures of about 900° C. to about 1100° C.

* * * * *